US006424018B1

(12) United States Patent
Ohtsuka

(10) Patent No.: US 6,424,018 B1
(45) Date of Patent: Jul. 23, 2002

(54) SEMICONDUCTOR DEVICE HAVING A HALL-EFFECT ELEMENT

(75) Inventor: Koji Ohtsuka, Kawagoe (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 09/555,361

(22) PCT Filed: Oct. 1, 1999

(86) PCT No.: PCT/JP99/05408

§ 371 (c)(1), (2), (4) Date: May 30, 2000

(30) Foreign Application Priority Data

Oct. 2, 1998 (JP) .......................................... 10-296022

(51) Int. Cl.[7] ................................................ H01L 43/00
(52) U.S. Cl. ....................................................... 257/421
(58) Field of Search ................................ 257/421, 422, 257/423, 424, 427

(56) References Cited

U.S. PATENT DOCUMENTS 5,572,058 A * 11/1996 Biard ......................... 257/421
5,627,398 A * 5/1997 Zlebier et al. .............. 257/727

FOREIGN PATENT DOCUMENTS

| | | | |
|---|---|---|---|
| JP | 53-7183 | | 1/1978 |
| JP | 4-364472 | | 12/1992 |
| JP | 10-282156 | | 10/1998 |
| JP | 10-293141 | | 11/1998 |
| JP | 10293141 | * | 11/1998 |

* cited by examiner

*Primary Examiner*—Fetsum Abraham
*Assistant Examiner*—Leonardo Andújar
(74) *Attorney, Agent, or Firm*—Woodcock Washburn LLP

(57) ABSTRACT

A first and a second Hall element (2 and 3) for current detection, in addition to a semiconductor element (4) for an electric circuit, are provided on a semiconductor substrate. A conductor layer (5), through which flows the current of the semiconductor element (4), is formed on an insulating film (20) on the surface of the semiconductor substrate. The conductor layer (5) is arranged along the first and second Hall elements (2 and 3) for higher sensitivity. The magnetic flux created by the flow of a current through the conductor layer (5) is applied to the first and second Hall elements (2 and 3). The first and second Hall voltages obtained from the first and second Hall elements (2 and 3) are totaled for higher sensitivity.

7 Claims, 8 Drawing Sheets

1
6
5
64
62
3
2
21
60
63
4
61

CONTROL CIRCUIT
CONTROL CURRENT CUPPLY CIRCUIT
Vh1
-Vh2
Vh1+Vh2
Is
1
2
3
4
5
16a
16b
17a
17b
18a
18b
19a
19b
21
29
30
31
60
61
62
63
64
65
66
67
68
69
70
71

SEMICONDUCTOR DEVICE HAVING A HALL-EFFECT ELEMENT

This application was filed under 35 U.S.C. § 371 and claims priority of PCT application Ser. No. JP99/05408, filed Oct. 1, 1999.

TECHNICAL FIELD

The present invention relates to a semiconductor device having a Hall-effect element or elements for current detection.

BACKGROUND ART

Integrated semiconductor circuits have been known in which a Hall-effect element or elements, built on the proportionality of the Hall voltage of a semiconductor to the applied magnetic field, and an amplifier or amplifiers for the Hall-effect element or elements are formed on a unitary semiconductor substrate.

Conventionally, however, the integrated circuits including Hall-effect elements have been used solely for detection of external magnetic fields (those applied from without the integrated circuits) and not for detection of input and output currents of other semiconductor elements within the integrated semiconductor circuits. Additionally, the prior art integrated circuits have not possess sufficient sensitivity to detect currents of relatively small magnitude flowing inside the circuits. Also, the integrated circuits including Hall-effect elements have not been constructed to be free from the influence of undesired external magnetic fields.

It is therefore an object of this invention to provide a semiconductor device capable of accurately and easily detecting the currents of electric circuits by a Hall-effect element.

DISCLOSURE OF INVENTION

The current-detecting semiconductor device according to the present invention comprises a semiconductor substrate having a Hall-effect element, an insulating film disposed on a surface of the semiconductor substrate, and a conductor layer disposed on the insulating film so as to extend along the Hall-effect element as seen in a planar view and so formed as to permit an electric current of an electric circuit to flow therein.

Thus the conductor layer for carrying a current to be detected can be disposed close to the Hall-effect element. As a result, the current can be accurately detected by the Hall-effect element. Also, the positional relationship between the Hall-effect element and the conductor layer can be accurately and easily determined, resulting in the reduction of fluctuations of the values detected.

Desirably, the conductor layer should be so formed as to surround the Hall-effect element in order to augment the amount of magnetic flux applied to the Hall-effect element.

It is also desirable to provide a first and a second Hall-effect element and to arrange the conductor layer so that magnetic fields may be applied to the first and the second Hall-effect element in opposite directions, for enhancement of current-detecting sensitivity and suppression of noise.

It is also desirable to provide a Hall-effect element or elements and another circuit element on the same semiconductor substrate for the provision of a compact and inexpensive semiconductor device having a Hall-effect element.

It is also desirable to provide a magnetic collector in order to cause the magnetic flux that has been produced by the current carried by the conductor layer, to work effectively on the Hall-effect element.

BEST MODE FOR CARRYING OUT THE INVENTION

First Mode

Figure 1:
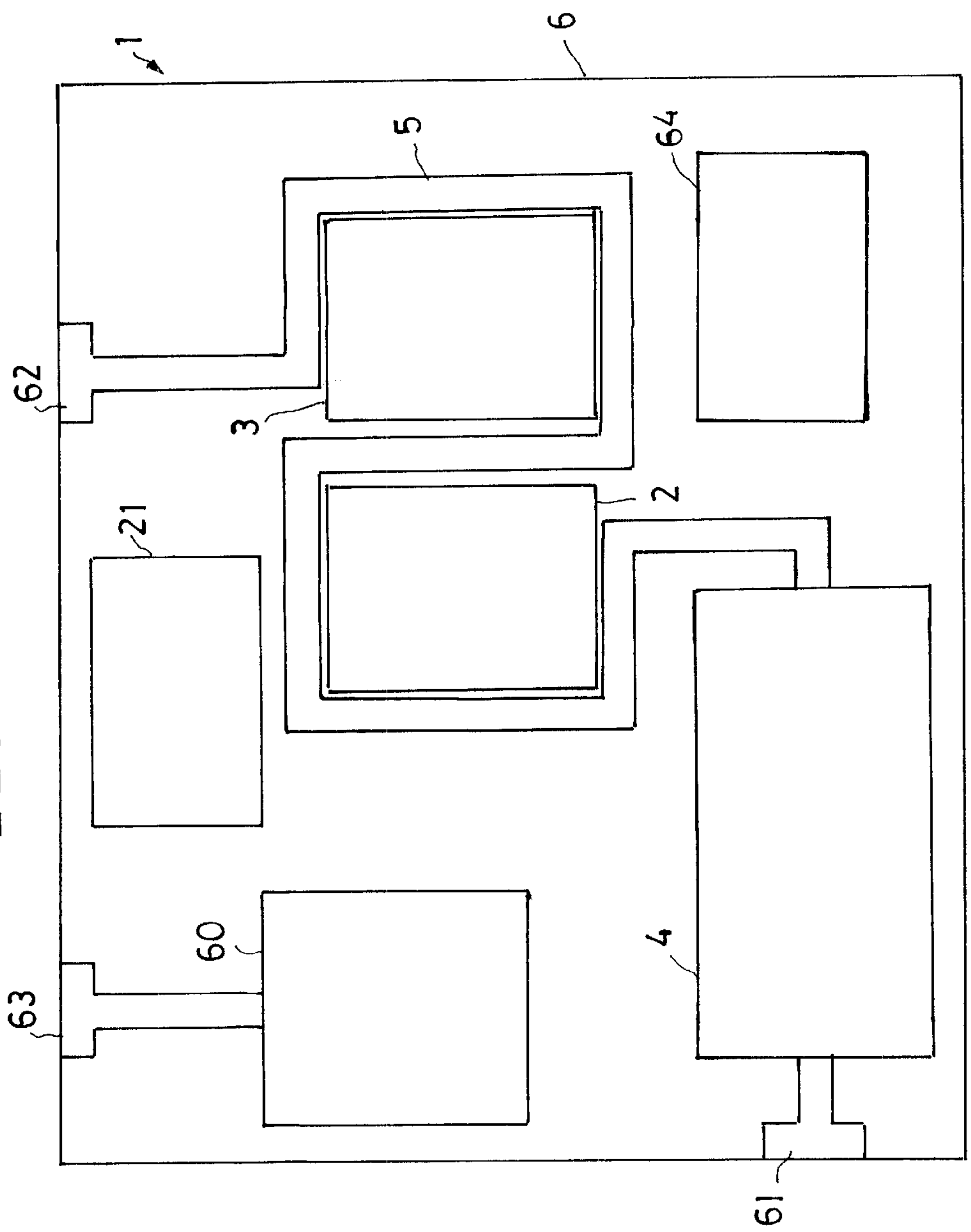
FIG. 1 is a plan view schematically illustrating a first preferred form of integrated circuit including a Hall-effect element according to the invention.

The first mode for carrying out the invention will now be described with reference to FIGS. 1 through 6. As is apparent from FIG. 1, the integrated circuit 1 illustrated therein as an example of semiconductor device according to the invention comprises a first and a second Hall-effect elements (hereinafter referred to as the Hall elements) 2 and 3, a semiconductor element 4, a conductor layer 5 providing a passageway for an electric current to be measured, a control current supply circuit 64 for supplying control currents to the first and second Hall elements 2 and 3, an output circuit 21 for processing outputs from the Hall elements 2 and 3, a control circuit 60 for the semiconductor element 4, and a first, a second and a third terminal 61, 62 and 63. In FIG. 1 the constituent elements and blocks of the integrated circuit 1 are shown as blocks, and their details are not shown. In this specification the primary parts of Hall effect elements, comprising semiconductor regions and electrodes formed thereon, will be collectively called Hall-effect elements or Hall elements.

Figure 2:
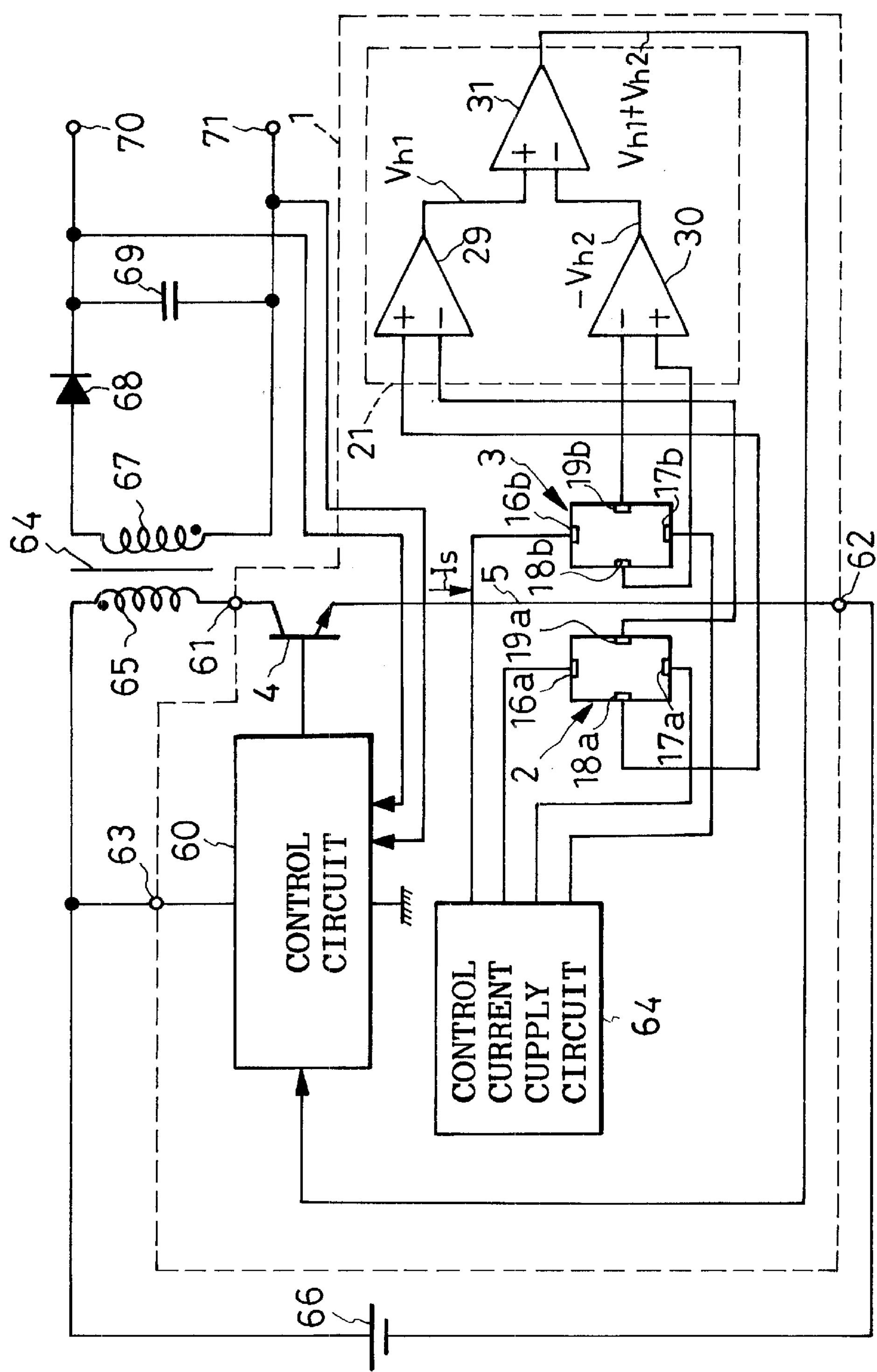
FIG. 2 is a circuit diagram of a d.c.-to-d.c. converter built on the principles of the integrated circuit of FIG. 1.

FIG. 2 is an illustration of the details of the electric circuitry of the FIG. 1 integrated circuit 1 as well as a d.c.-to-d.c. converter using the same. A semiconductor element 4, a circuit element of the integrated circuit 1, takes the form of a transistor acting as a switching element of the d.c.-to-d c. converter. One terminal (collector) of this semiconductor element 4 is connected to one terminal of a d.c. power supply 66 via a primary winding 65 of a transformer 64. The other terminal (emitter) of the semiconductor element 4 is connected to the other terminal of the d.c. power supply 6 by way of a conductor constituted of the conductive layer 5 providing the passageway for the current under measurement. The semiconductor element 4 has a control terminal (base) connected to the control circuit 60. The control circuit 60 produces a control circuit for on-off control of the semiconductor element 4. A smoothing capacitor 69 is connected to the secondary winding 67 of a transformer 64 via a rectifying diode 68. A pair of output terminals 70 and 71, connected across the smoothing capacitor 69, are for connection of a load, not shown, therebetween. The d.c. output voltage between the pair of output terminals 70 and 71 is also applied to the control circuit 60 thereby to be used for holding the d.c. output voltage constant.

The first and second Hall elements 2 and 3 are both disposed along the current passageway conductor layer 5 for detection of the current Is flowing through the semiconductor element 4. For supplying the known control currents to the first and second Hall elements 2 and 3, the known control current supply circuit 64 is connected to the first pair of electrodes 16*a* and 17*a* of the first Hall element 2 and to the first pair of electrodes 16*b* and 17*b* of the second Hall element 3. Designed to provide a voltage corresponding to the current Is under measurement by combining the output voltages of the two Hall elements 2 and 3, the output circuit 21 comprises a first, a second, and a third differential amplifier 29, 30 and 31. The first differential amplifier has a positive input connected to one second electrode 18*a* of the first Hall element 2, and a negative input connected to another second terminal 19*a* of the first Hall element 2. The second differential amplifier 30 has a positive input connected to one second electrode 18*b* of the second Hall element 3, and a negative input connected to another second terminal 19*b* of the second Hall element 3. Consequently, the first Hall voltage $Vh_1$ obtained from the first differential amplifier 29 is opposite in polarity to the second Hall voltage$-Vh_2$ obtained from the second differential amplifier 30. The third differential amplifier 31 has a positive input connected to the first differential amplifier 29, and a negative input connected to the second differential amplifier 30. Thus the third differential amplifier 31 provides the output, $Vh_1-(-Vh_2)=Vh_1+Vh_2$. In other words, the third differential amplifier 31, an arithmetic means, provides the sum of the absolute value of the output $Vh_1$ from the first differential amplifier 29 and the absolute value of the output $-Vh_2$ from the second differential amplifier 30.

Incidentally, an output representative of $(Vh_1+Vh_2)$ could be obtained by providing an inverter circuit on the output stage of the second differential amplifier 30, and an adder in place of the third differential amplifier 31.

Figure 4:
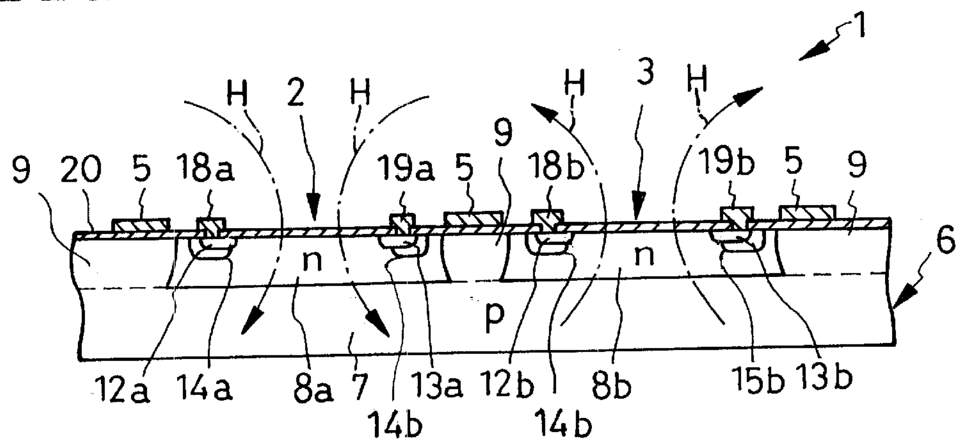
FIG. 4 is a sectional view of the first preferred form of integrated circuit, taken along the line A—A in FIG. 3.
Figure 5:
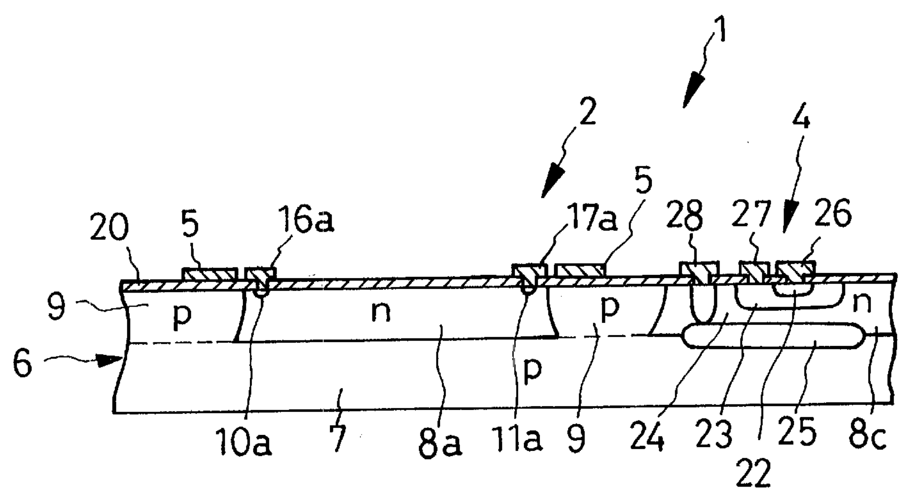
FIG. 5 is a sectional view of the first preferred form of integrated circuit, taken along the line B—B in FIG. 3.

The semiconductor substrate 6 with the first and second Hall elements 2 and 3, semiconductor 4, etc., thereon is formed from a semiconductor wafer having a p-type (first conductivity type) semiconductor substrate in the form of, for example, monocrystaline sheet silicon with n-type (second conductivity type) silicon grown epitaxially thereon. In FIGS. 4 and 5 the lower p-type semiconductor region 7 of the semiconductor substrate 6 is a substrate region, and the upper n-type main semiconductor regions 8*a*, 8*b* and 8*c* and the P-type isolation regions 9 therebetween are epitaxially grown regions. The p-type isolation regions 9 are formed by p-type impurity diffusion in type epitaxially grown regions. The first and second n-type main semiconductor regions 8*a* and 8*b* for providing the first and second Hall elements 2 and 3 are juxtaposed via the isolation region 9. The regions 7, 8*a*, 8*b* and 9 could all be the other way around in conductivity type.

The first and second n-type semiconductor regions (hereinafter referred to as the "Hall semiconductor regions") 8*a* and 8*b*, for giving the Hall effect to the first and second Hall elements 2 and 3, are islands surrounded by the p-type semiconductor region 7 and p-type isolation region 9, cruciate in shape as seen n a plan view as in FIG. 6. In the first Hall semiconductor region 8*a* there are formed a pair of n-type semiconductor regions 10*a* and 11*a* for supplying control current, a pair of n-type semiconductor regions 12*a* and 13*a* for Hall voltage detection, and a pair of p-type semiconductor regions 14*a* and 15*a*. In the second Hall semiconductor region 8*b*, as in the first Hall semiconductor region 8*a*, there are provided a pair of n-type semiconductor regions 10*b* and 11*b* for supplying control current, a pair of n-type semiconductor regions 12*b* and 13*b* for Hall voltage detection, and a pair of p-type semiconductor regions 14*b* and 15*b*. The first and second Hall elements 2 and 3 are essentially alike in construction, so that like parts are identified by like reference numerals, only with a suffixed to the reference numerals of one Hall element, and b suffixed to the reference numerals of the other Hall element, by way of distinction therebetween. Only one Hall element 2 will be explained in detail, and the other Hall element 3 not.

Figure 6:
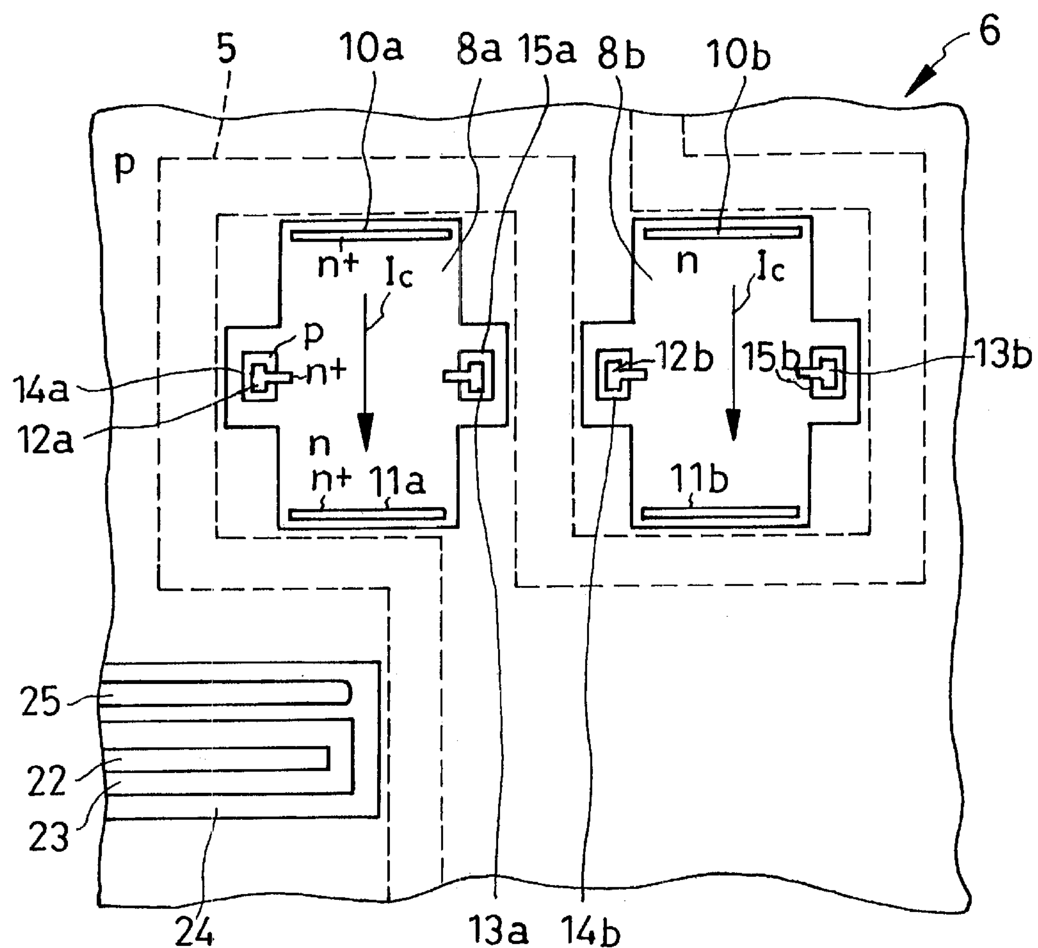
FIG. 6 is a plan view of the semiconductor substrate seen in FIG. 4.

In the first Hall element 2, the pair of control current supply semiconductor regions 10*a* and 11*a* are formed by n-tpe impurity diffusion adjacent the both ends of the Hall semiconductor region 8*a*, which constitutes the primary part of this Hall element 2, in its longitudinal direction or in the direction of the y-axis in FIG. 6. The pair of control current supply semiconductor regions 10*a* and 11*a* are higher in impurity concentration than the Hall semiconductor region 8*a* The first pair of electrodes 16*a* and 17*b* are in ohmic contact with the pair of semiconductor regions 10*a* and 11*a*. Centrally of the Hall semiconductor region 8*a* in the direction of the taxis in FIG. 6, and adjacent opposite ends thereof, the pair of p-type semiconductor regions 14*a* and 15*a* are formed by p-type impurity diffusion. These p-type semiconductor regions 14*a* and 15*a* are for limiting the areas of contact of the pair of Hall-voltage-detecting n-type semiconductor regions 12*a* and 13*a* with the Hall semiconductor region 8*a* Formed by n-type impurity diffusion, the pair of Hall-voltage-detecting semiconductor regions 12*a* and 13*a* are disposed adjacent the Hall semiconductor region 8*a* via the p-type semiconductor regions 14*a* and 15*a* These Hall-voltage-detecting n-type semiconductor regions 12*a* and 13*a* are higher in impurity concentration than the Hall semiconductor region 8*a* The second pair of electrodes 18*a* and 19*a* are in ohmic contact with the n-type semiconductor regions 12*a* and 13*a*. That part of the Hall semiconductor region 8*a* which lies between the pair of Hall-voltage-detecting semiconductor regions 12*a* and 13*a* are at right angles with that part of the Hall semiconductor region 8*a* which lies between the pair of control-current-supplying semiconductor regions 10*a* and 11*a*

As illustrated in both FIGS. 4 and 5, an insulating film 20 is provided on one main surface of the semiconductor substrate 6. Through apertures formed in this insulating film 20, the first pair of electrodes 16*a* and 17*a* make ohmic contact with the pair of n-type control-current-supplying semiconductor regions 10*a* and 11*a*, and the second pair of electrodes 18*a* and 19*a* make ohmic contact with the pair of n-type Hall-voltage-detecting semiconductor regions 12*a* and 13*a* The first pairs of electrodes 16*a* sand 17*a*, and 16*b* and 17*b*, of the fist and second Hall elements 2 and 3 are connected to the control current supply circuit 64 shown in FIG. 2. Also, the second pairs of electrodes 18*a* and 19*a*, and 18*b* and 19*b*, of the first and second Hall elements 2 and 3 are connected to the Hall-voltage-detecting output circuit 21, as illustrated in FIG. 2.

In order to provide a current detector constituted of the first and second Hall elements 2 and 3, the conductor layer 5 for the passage of a current under measurement is provided on the insulating film 20. As seen in a direction normal to one main surface of the semiconductor substrate 6 shown in FIG. 3, or as seen in a plan view, the conductor layer 5 is so formed as to nearly surround the first and second Hall semiconductor regions 8*a* and 8*b* of the first and second Hall elements 2 and 3 and to extend between the first and second Hall semiconductor regions 8*a* and 8*b*. More specifically, the conductor layer 5 comprises a first portion 5*a* in the shape of a U surrounding the fist Hall semiconductor region 8*a*, a second portion 5*b* also in the shape of a U surrounding the second Hall semiconductor region 8*b* a third portion 5*c* bridging the first and second portions 5*a* and 5*b*, and a fourth and a fifth portion 5*d* and 5*e* extending from the first and the second portion 5*a* and 5*b* The first, second and third portions 5*a*, 5*b* and 5*c* as a whole is in the shape of an S. As illustrated in FIG. 1, the conductor layer 5 is connected to the semiconductor element 4, so that the current Is flows through the semiconductor element 4 and the conductor layer 5.

Figure 3:
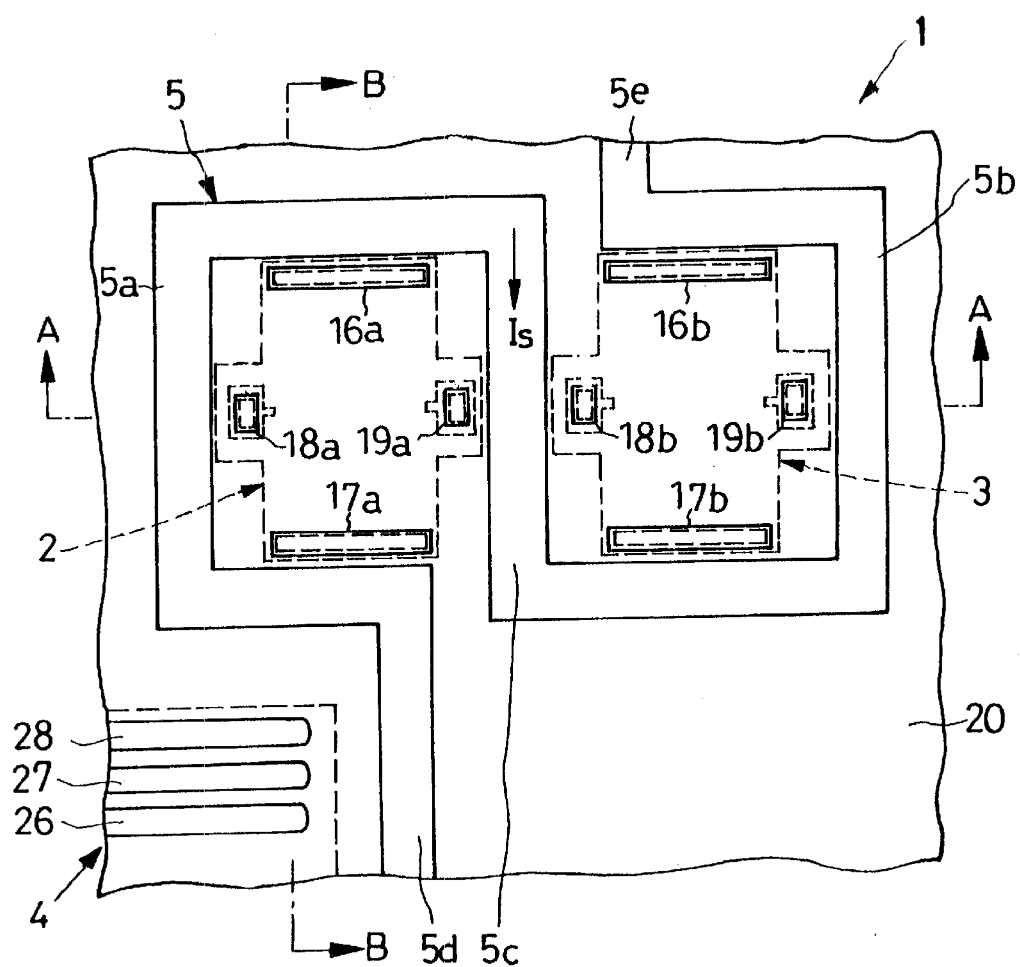
FIG. 3 is a fragmentary plan view showing the integrated circuit of FIG. 1 in more detail.

As schematically illustrated in FIGS. 3, 5 and 6, the semiconductor element 4 is formed on the same semiconductor substrate 6 as the first and the second Hall element 2 and 3. That is, in FIGS. 3, 5 and 6, there is shown as the semiconductor element 4 a transistor of known configuration comprising an n-type emitter region 22, a p-type base region 23, an n-type collector region 24, an $n^+$-type collector region 25, an emitter electrode 26, a base electrode 27, and a collector electrode 28. The known control current supply circuit 64, output circuit 21, and control circuit 60, all shown in FIGS. 1 and 2, are also conventionally formed on the semiconductor substrate 6. The conductor layer 5 disposed along the fist and second Hall elements 2 and 3 is a metallic layer formed concurrently with other conductor layers, not shown, formed on the insulating film 20 for wiring purposes.

The current Is of the semiconductor element 4 flows through the conductor layer 5 as indicated by the arrow in FIG. 3 by way of example, that is, from the fourth portion 5*d* to the fifth portion 5*e* of the conductor layer 5. The result, according to Ampere's right-handed screw rule, is the creation of the magnetic lines of force H, or magnetic flux, oriented in the arrow-marked direction in FIG. 4.

As is apparent from the direction of the magnetic lines of force H in FIG. 2, the magnetic lines of force H acting on the Hall semiconductor region 8*a* of the first Hall element 2 is opposite in direction to the magnetic lines of force H acting on the Hall semiconductor region 8*b* of the second Hall element 3. During current measurement, as is well known, a control current Ic is made to flow between the first pairs of electrodes 16*a* and 17*a*, and 16*b* and 17*b*, of the first and second Hall elements 2 and 3. Since the direction of the magnetic lines of force H is at right angles with the direction of the control current IC, the first and second Hall voltages $Vh_1$ and $-Vh_2$ are generated respectively between the second pairs of electrodes 18*a* and 19*a*, and 18*b* and 19*b*, of the first and second Hall elements 2 and 3. The absolute values of the first and second Hall voltages $Vh_1$ and $-Vh_2$ are proportional to the magnitude of the current flowing through the conductor layer 5. As the first and second differential amplifiers 29 and 30 provide the first and second Hall voltages $Vh_1$ and $-Vh_2$ of opposite polarities, the third differential amplifier 31 provides the output $Vh_1+Vh_2$, that is, the sum of the absolute values of the output voltages of the first and second Hall elements 2 and 3. The first and second Hall elements 2 and 3 are the same in pattern, so that the first and second Hall voltages $Vh_1$ and $Vh_2$ are substantially equal to each other. Consequently, the output from the third differential amplifier 31 is $2Vh_1$, twice the output from each Hall element.

The above described mode of carrying out the invention possesses the following advantages:

(1) The conductor layer 5 for the passage of an electric current to be measured is formed on the insulating film 20 on the surface of the semiconductor substrate 6 having the first and second Hall elements 2 and 3, the conductor layer being disposed adjacent the Hall elements 2 and 3, so that the passageway for the current under measurement is disposed close to the Hall elements 2 and 3, resulting in the enhancement of sensitivity for detecting the current Is.

(2) The conductor layer 5 as the passageway for the current under measurement is so arranged as to surround approximately 90 percent of the peripheries of the Hall elements 2 and 3. Consequently, the magnetic fields or magnetic lines of force H can be made to act on the first and second Hall semiconductor regions 8*a* and 8*b* from the directions of all the four sides of the first and second Hall semiconductor regions 8*a* and 8*b* which are approximately rectangular in shape as seen in a plan view. As large amounts of magnetic flux thus act effectively on the first and second Hall semiconductor regions 8*a* and 8*b*, the current Is can be detected more accurately than heretofore.

(3) Current detection sensitivity is enhanced as there is obtained the sum of the absolute values of the outputs from the first and second Hall elements 2 and 3.

(4) The space requirement of the integrated circuit 1 is reduced as the first and second Hall elements 2 and 3 share the third portion 5*c* of the conductor region 5.

(5) The first and second Hall elements are juxtaposed to provide a combined output, and the conductor layer 5 surround the first and second Hall elements 2 and 3 in opposite directions, so that current detection is possible with little or no influence of external magnetic fields as such fields counteract each other when applied to the fist and second Hall elements 2 and 3. Let $V_o$ be the Hall voltage due to an extraneous magnetic field. Then the output from the first differential amplifier 29 will be $Vh_1+V_o$, the output from the second differential amplifier 30 $-Vh_2+V_o$, and the output from the third differential amplifier 31 $Vh_1+V_o-(-Vh_2+V_o)=Vh_1+Vh_2$. The output will be little affected by the extraneous magnetic fields, resulting in the enhancement of accuracy with which the current Is is detected.

(6) The conductor layer 5 can be fabricated concurrently with the fabrication of another necessary conductor layer of the integrated circuit 1, without adding much to its manufacturing cost. It is therefore less expensive than prior art integrated circuits or the like utilizing gigantic magnetoresistive effect elements.

Second Mode

The second preferred form of integrated circuit la including Hall elements according to the invention will now be described with reference to FIGS. 7 and 8. Those parts of this integrated circuit 1*a* which have like parts in the FIGS. 1 through 6 embodiment will be identified by like reference characters, and their description will be omitted.

Figure 7:
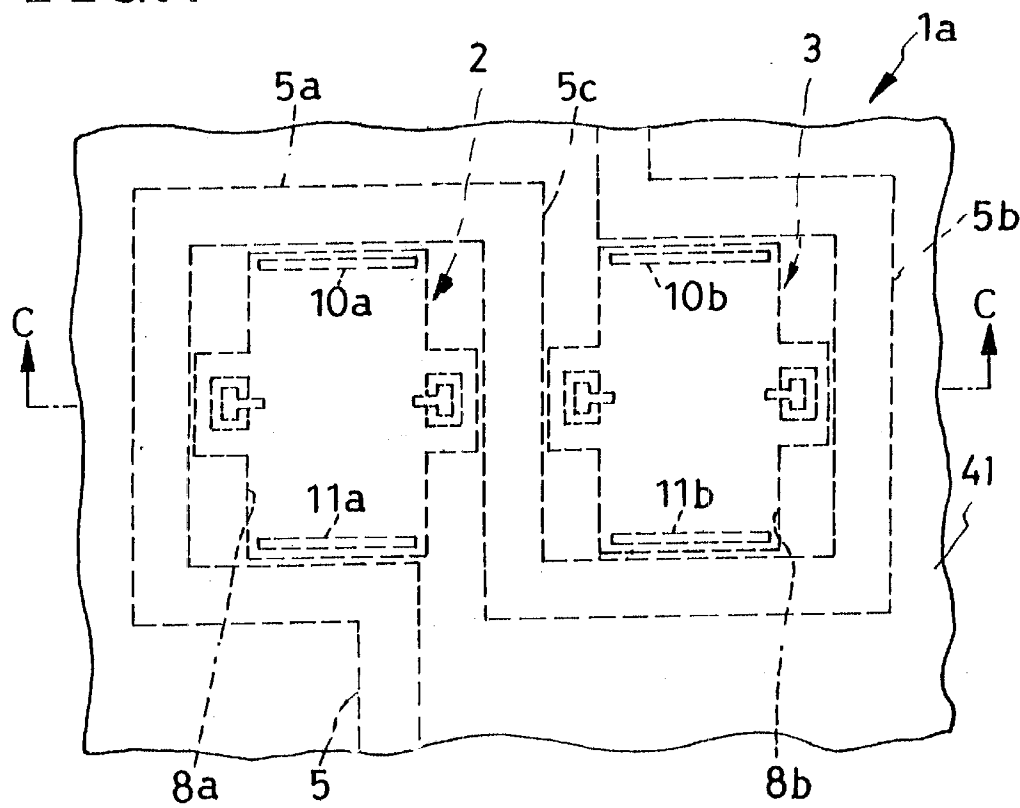
FIG. 7 is a fragmentary plan view of a second preferred form of integrated circuit according to the invention.
Figure 8:
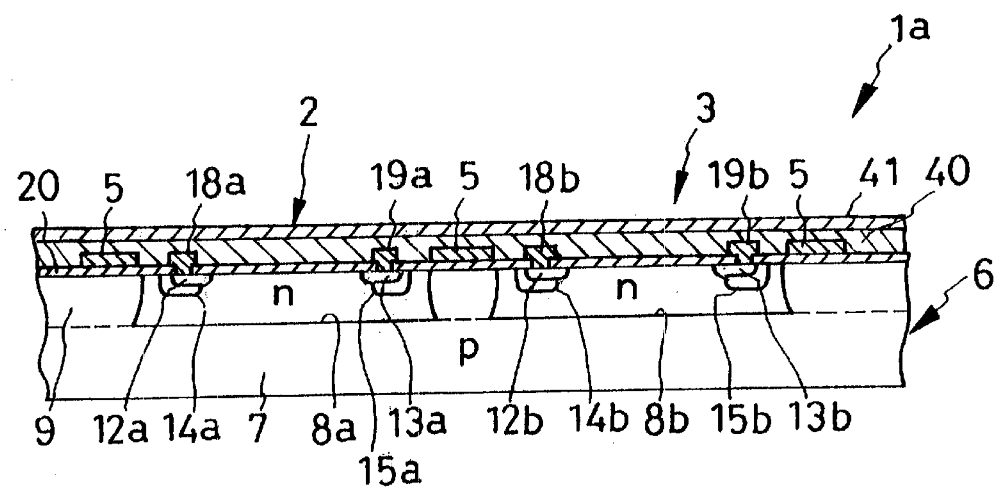
FIG. 8 is a section through the integrated circuit of FIG. 7, taken along the line C—C therein.

The integrated circuit 1*a* of FIGS. 7 and 8 newly comprises an insulating layer 40 and a magnetic collector plate 41 fabricated from a material of high magnetic permeability such as Fe, Ni, or Fe-Ni alloy, the other details of construction being akin to those of the FIGS. 1 through 6 integrated circuit 1. As is apparent from a consideration of FIG. 8, the insulating layer 40 is so formed as to cover the electrodes 16*a*, 16*b*, 17*a*, 17*b*, 18*a*, 18*b*, 19*a* and 19*b*, insulating film 20, and conductor layer 5.

The magnetic collector plate 41 overlies the insulating layer 40. Being higher than air in magnetic permeability, the magnetic collector plate 41 contributes to the improvement of the sensitivity of the Hall elements 2 and 3 by favorably directing to the Hall semiconductor regions 8*a* and 8*b* the magnetic flux that has been created by the current flowing in the conductor layer 5. The collector plate 41 should be so arranged as to completely cover the first and second Hall elements 2 and 3 and conductor layer 5 for collecting all of the magnetic flux generating from the current-carrying conductor layer 5.

Third Mode

Figure 9:
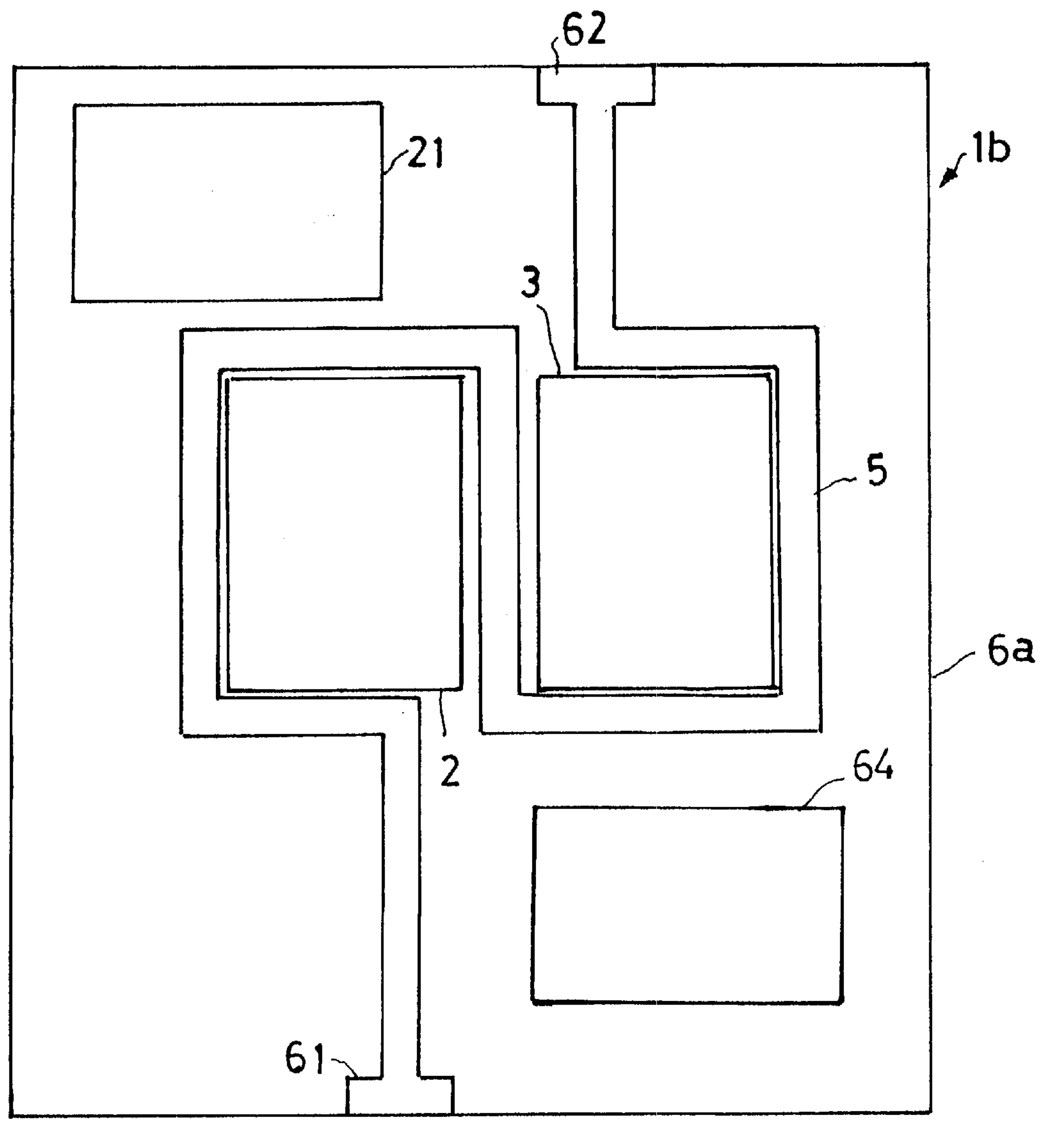
FIG. 9 is a view similar to FIG. 1 but showing a third preferred form of integrated circuit according to the invention.

FIG. 9 is a plan view similar to FIG. 1 but showing a third preferred form of integrated circuit 1*b* according to the invention. The integrated circuit 1*b* of FIG. 9 is similar to the FIG. 1 integrated circuit 1 except for the absence of the semiconductor element 4 and control circuit 60. Therefore, in FIG. 9, parts having corresponding parts in FIGS. 1 through 9 will be identified by like reference characters, and their description omitted.

The integrated circuit 1*b* of FIG. 9 is an integration of the first and second Hall elements 2 and 3, the conductor layer 5 providing the path for the current to be measured, the control current supply circuit 64, and the output circuit 21, on the common semiconductor substrate 6*a* The relationship between the first and second Hall elements 2 and 3 and the conductor layer 5 in FIG. 9 is the same as that of FIG. 1, so that the FIG. 9 integrated circuit 1*b* gains the same advantages as does the FIG. 1 integrated circuit 1.

Fourth Mode

Figure 10:
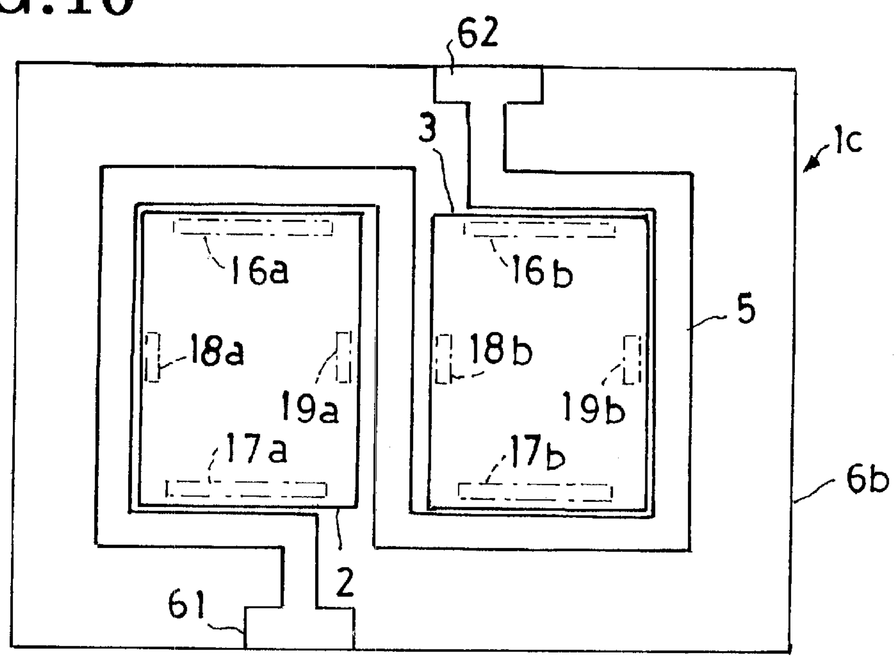
FIG. 10 is a plan view similar to FIG. 1 but showing a fourth preferred form of integrated circuit having a pair of Hall-effect elements according to the invention.

FIG. 10 shows a fourth preferred form of integrated circuit 1*c* according to the invention, having the first and second Hall elements 2 and 3. The integrated circuit 1*c* is formed by omitting the control current supply circuit 64 and control circuit 21 from the FIG. 6 integrated circuit 1*b* and is similar in the other details of construction to that of FIG. 9. Therefore, the parts having corresponding parts in FIG. 9 will be identified by like reference characters in FIG. 10, and their description will be omitted. In FIG. 10 the electrodes 16*a*, 16*b*, 17*a*, 17*b*, 18*a*, 18*b*, 19*a* and 19*b* are indicated by broken lines.

The FIG. 10 integrated circuit 1*c* posses the first and second Hall elements 2 and 3 and the conductor layer 5 like those of FIGS. 1 and 9, so that they offer the same advantages as do the FIGS. 1 and 9 integrated circuits 1 and 1*b*.

Also, in the FIG. 10 integrated circuit 1*c*, the second electrode 19*a* of the first Hall element 2 and the second electrode 19*b* of the second Hall element 3 can be electrically interconnected, and a Hall voltage detection signal can be obtained from between the second electrode 18*a* of the first Hall element 2 and the second electrode 18*b* of the second Hall element 3. In this case there can be obtained from between the electrodes 18*a* and 18*b* the addition, $Vh_1+Vh_2$, of the first and second Hall voltages $Vh_1$ and $Vh_2$ of the first and second Hall elements 2 and 3.

Also, in the FIG. 10 integrated circuit 1*c*, the second electrode 18*a* of the first Hall element 2 and the second electrode 18*b* of the second Hall element 3 can be electrically interconnected, and the addition, $Vh_1+Vh_2$, of the first and second Hall voltages $Vh_1$ and $Vh_2$ of the first and second Hall elements 2 and 3 can be obtained from between the second electrode 19*a* of the first Hall element 2 and the second electrode 19*b* of the second Hall element 3.

Fifth Mode

Figure 11:
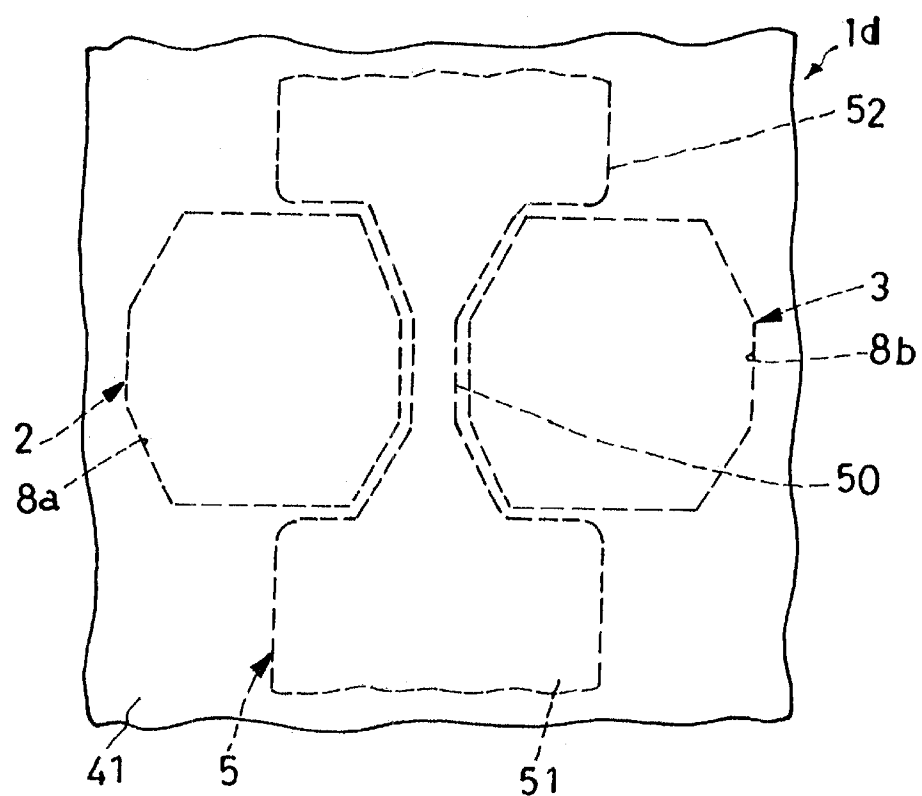
FIG. 11 is a fragmentary plan view similar to FIG. 1 but showing a fifth preferred form of integrated circuit according to the invention.

FIG. 11 shows a fifth preferred form of integrated circuit 1*d* according to the invention, which is similar to the FIGS. 7 and 9 integrated circuit 1*a* except for the patterns of the first and second Hall semiconductor regions 8*a* and 8*b* and the current path conductor layer 5. Therefore, those parts of this integrated circuit 1*d* which have their counterparts in FIGS. 7 and 8 will be identified by like reference characters, and their description will be omitted.

FIG. 11 does not show the details of the first and second Hall elements 2 and 3 but does show the patterns of the fall semiconductor regions 8*a* and 8*b* which have been herein modified into hexagonal shape.

The current path conductor layer 5 of FIG. 11 is formed to include a narrow portion 50 and a pair of wide portions 51 and 52. The narrow portion 50 is disposed between the pair of Hall elements 2 and 3, and the wide portions 51 and 52 are disposed away from the Hall elements. The collector plate 41 is disposed as in FIG. 7 over the two Hall elements 2 and 3 and the conductor layer 5.

The FIG. 11 integrated circuit 1*d* posses the following advantages in addition to those gained in the first and the second mode:

1. As the current density is made higher in the narrow portion 50, the magnetic flux generated due to the current flowing in the narrow portion 50 of the current path conductor layer 5 can be made to act effectively on the Hall elements 2 and 3, resulting in further improvement of the current-detecting sensitivity.
2. The conductor layer 5*a* with its wide portions 51 and 52 favorably radiates heat, making it possible to detect currents of greater magnitude.
3. The space requirement of the integrated circuit 1*d* is reduced as the current path conductor layer 5 is disposed between, and shared by, the two Hall elements 2 and 3.

The present invention is not to be limited by the details of the above described modes of carrying out the invention but admits of modifications such as the following:

1. The embodiments of FIGS. 1 through 11 could dispense with either of the two Hall elements 2 and 3 and detect a current with the remaining one only. If the first Hall element 2 is to be left in the integrated circuits 1, 1*a*, 1*b* and 1*c* of FIGS. 1 through 10, the current should preferably be made to flow through the first and third portions 5*a* and 5*c* of the conductor layer 5. Alternatively, three or more Hall elements could be provided to obtain the combined output therefrom.
2. In FIGS. 1 through 10 the conductor layer 5 could be constituted of only the third portion 5*c* between the Hall elements 2 and 3. This arrangement also can curtail the effects of external magnetic fields (noise). The conductor layer 5 should preferably surround one half or more of the periphery of each of the Hall elements 2 and 3.
3. The magnetic collector 41 could be provided only in limited regions above the Hall semiconductor regions 8*a* and 8*b*.

4. The magnetic collector 41 could be replaced by that in the form of a ferrite-containing resin layer provided on the Hall elements 2 and 3.
5. The conductor layer could be formed in the form of coils by the known lamination technology, and the Hall elements 2 and 3 surrounded by these coils.

Industrial Applicability as is apparent from the foregoing, the semiconductor devices having a hall element or elements find use for current measurement of electric circuits such as switching regulators.

What is claimed is:

1. A semiconductor device for measurement of an electric current in an electric circuit, characterized by comprising:

a semiconductor substrate having a Hall-effect element;

an insulating film disposed on a surface of said semiconductor substrate;

a conductor layer disposed on said insulating film so as to extend along said Hall-effect element as seen in a plan view and so formed as to permit the flow therethrough of an electric current of said electric circuit;

an insulation layer disposed on said conductor layer; and a magnetic collector plate disposed on said insulation layer so as to direct to said Hall-effect element a magnetic flux that has been generated by the current carried by said conductor layer.

2. A semiconductor device as claimed in claim 1, characterized in that said conductor layer surrounds not less than one half of the periphery of said Hall-effect element.

3. A semiconductor device as claimed in claim 1 or 2, characterized in that said semiconductor substrate has another circuit element, and that said conductor layer is connected to said other circuit element so that a current flows through said other circuit element and said conductor layer.

4. A semiconductor device for measurement of an electric current in an electric circuit, characterized by comprising:

a semiconductor substrate having a first and a second Hall-effect element;

an insulating film disposed on a surface of said semiconductor substrate;

a conductor layer disposed on said insulating film so as to apply to said first Hall-effect element a magnetic field oriented in a first direction and to said second Hall-effect element a magnetic field oriented in a second direction opposite to said first direction, said conductor layer being so formed as to permit the flow therethrough of an electric current of said electric circuit;

an insulation layer disposed on said conductor layer; and a magnetic collector plate disposed on said insulation layer so as to direct said Hall-effect element a magnetic flux that has been generated by the current carried by said conductor layer.

5. A semiconductor device as claimed in claim 4, characterized in that said conductor layer is formed to comprise:

a U-shaped first portion surrounding said first Hall-effect element;

a U-shaped second portion surrounding said second Hall-effect element; and a third portion disposed between said first and second Hall-effect elements and interconnecting said first and second portions.

6. A semiconductor device as claimed in claim 4 or 5, characterized in that said output means comprises:

a first amplifier connected to said first Hall-effect element;

a second amplifier connected to said second Hall-effect element; and arithmetic means connected to said first and second amplifiers for providing the sum of the absolute values of outputs from said first and second amplifiers.

7. A semiconductor device as claimed in claim 4 or 5, wherein said semiconductor substrate has another circuit element, characterized in that said conductor layer is connected to said other circuit element so that the current that has flowed through said other circuit element may flow through said conductor layer.

* * * * *

UNITED STATES PATENT AND TRADEMARK OFFICE

CERTIFICATE OF CORRECTION

PATENT NO. : 6,424,018 B1
DATED : July 23, 2002
INVENTOR(S) : Ohtsuka

It is certified that error appears in the above-identified patent and that said Letters Patent is hereby corrected as shown below:

Column 4,
Line 26, please delete "n-tpe" and insert therefor -- n-type --;
Line 35, please delete "taxis" and insert therefor -- y-axis --;
Line 63, please delete "sand" and insert therefor -- and --;
Line 64, please delete "fist" and insert therefor -- first --;

Column 5,
Line 56, please delete "IC" and insert therefor -- Ic --;

Column 6,
Line 43, please delete "fist" and insert therefor -- first --;

Column 9,
Line 9, please delete "as" and insert therefor -- As --;
Line 10, please delete "hall" and insert therefor -- Hall --.

Signed and Sealed this

Twenty-second Day of April, 2003

JAMES E. ROGAN
*Director of the United States Patent and Trademark Office*